(12) United States Patent
Jung et al.

(10) Patent No.: US 7,179,140 B2
(45) Date of Patent: Feb. 20, 2007

(54) METHOD FOR CONNECTING AN ELECTRIC CONDUCTOR ELECTRICALLY TO AN ELECTRONIC COMPONENT

(75) Inventors: Stefan Jung, Munich (DE); Christl Lauterbach, Hohenkirchen-Siegertsbrunn (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/861,316

(22) Filed: Jun. 4, 2004

(65) Prior Publication Data

US 2004/0266244 A1   Dec. 30, 2004

(30) Foreign Application Priority Data

Jun. 6, 2003   (DE) ................ 103 25 884

(51) Int. Cl.
*H01R 4/10* (2006.01)
(52) U.S. Cl. .................................... 439/877
(58) Field of Classification Search ........... 439/877, 439/37
See application file for complete search history.

(56) References Cited

FOREIGN PATENT DOCUMENTS

| DE | 198 39 114 A1 | 3/2000 |
|---|---|---|
| FR | 2 842 029 A1 | 1/2004 |
| GB | 1088768 | 10/1967 |

*Primary Examiner*—Javaid H. Nasri
(74) *Attorney, Agent, or Firm*—Dickstein Shaprio LLP

(57) ABSTRACT

Contact-making device and method for connecting an electric conductor, in particular a wire-like and/or thread-like electric conductor which is arranged in a textile material, electrically to an electronic component. The device includes a substrate material, and at least one contact, which is formed on the substrate material, to connect the electric conductor electrically to the electronic component, the contact comprising a movable section and an immovable section. The movable section is formed such that, during the electrical connection operation, it is arranged substantially on a surface side opposite the immovable section.

3 Claims, 7 Drawing Sheets

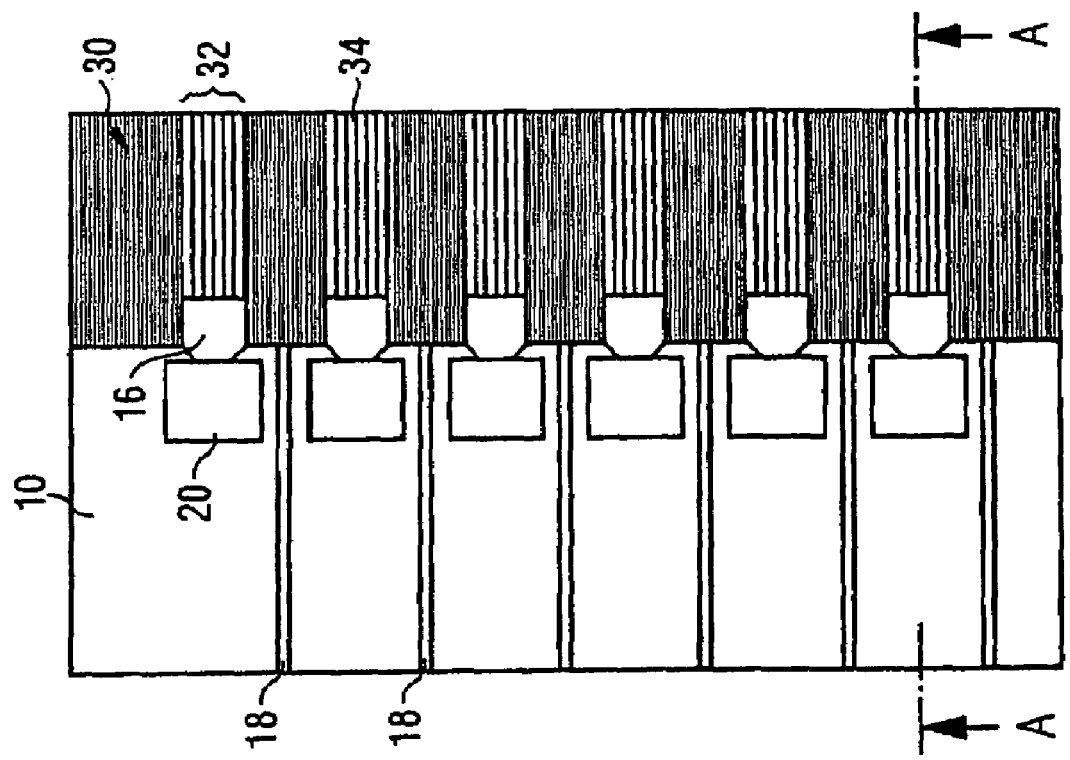
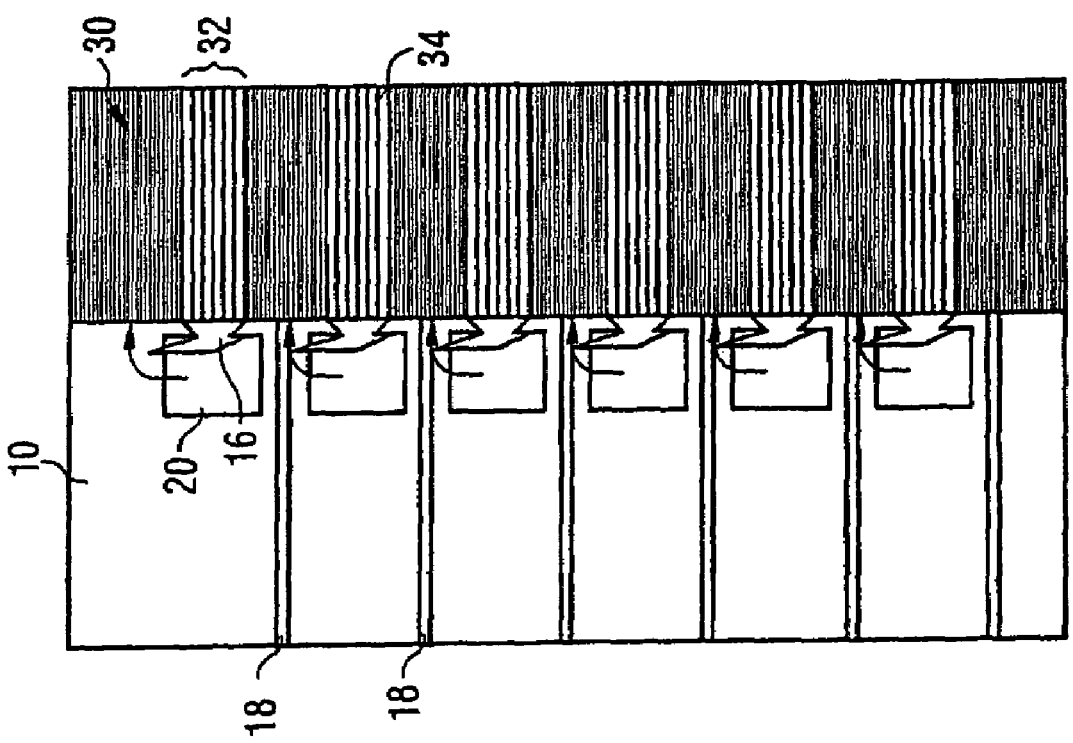

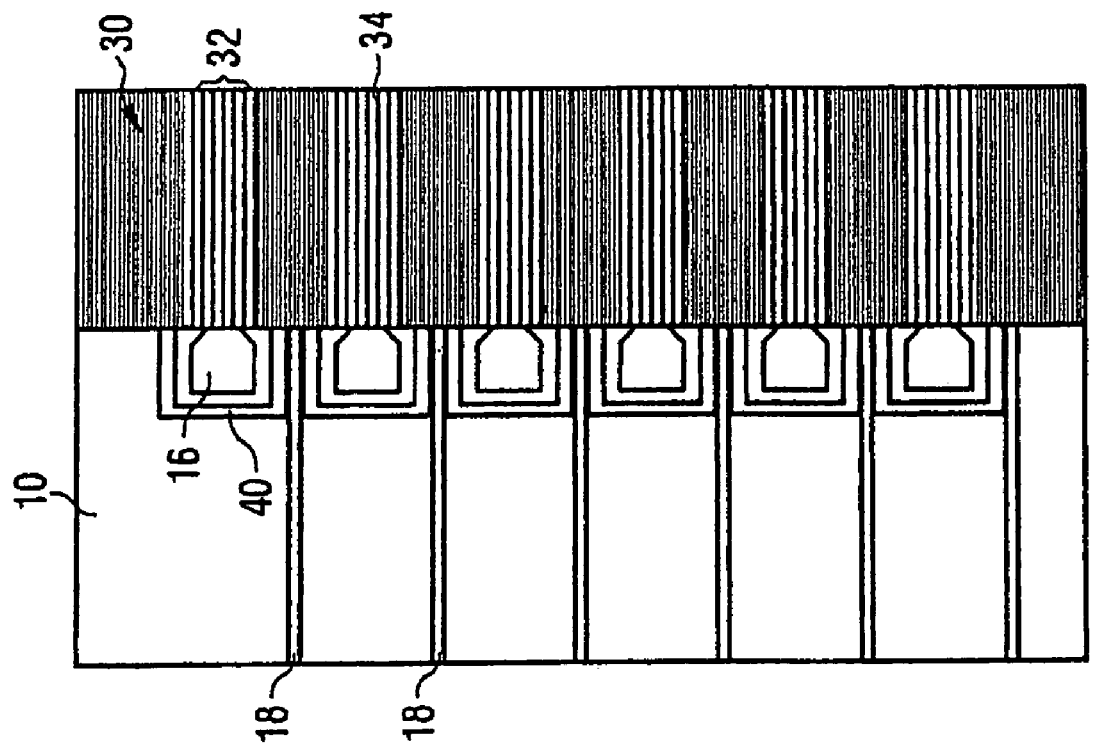
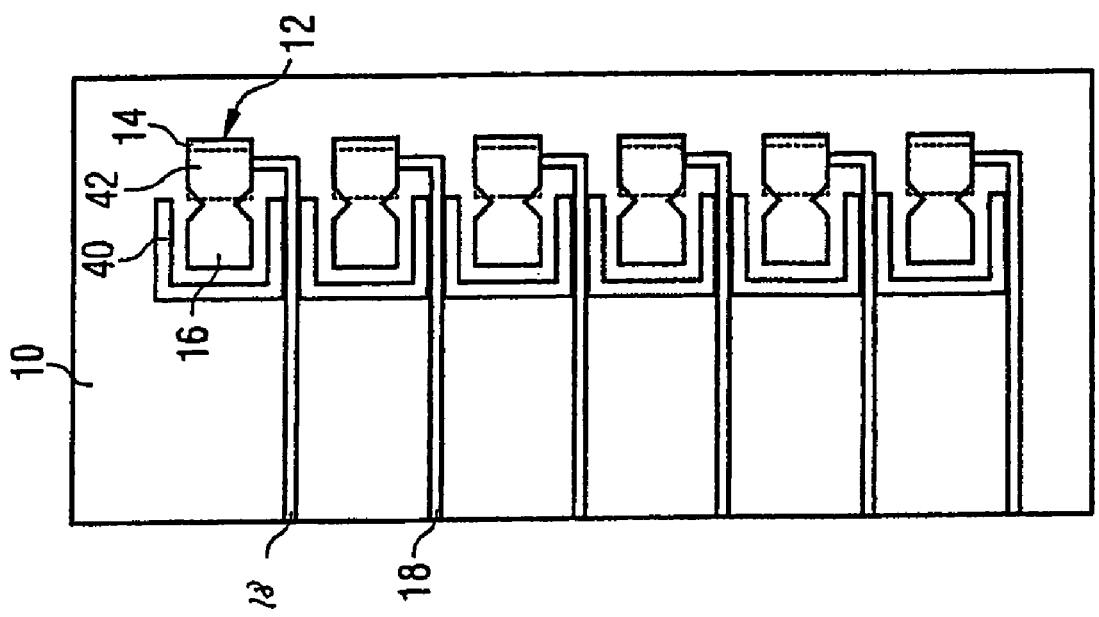

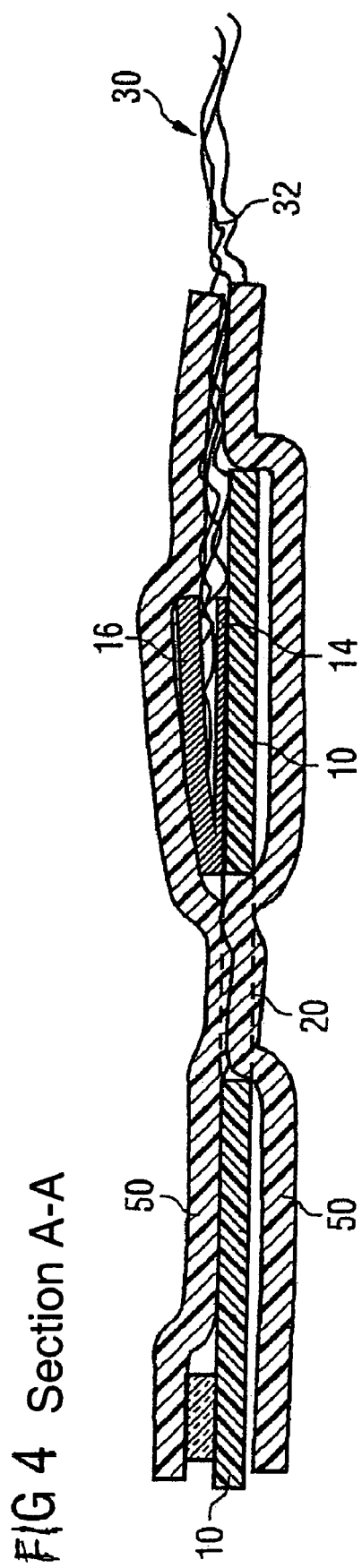
FIG 4 Section A-A

METHOD FOR CONNECTING AN ELECTRIC CONDUCTOR ELECTRICALLY TO AN ELECTRONIC COMPONENT

CROSS-REFERENCE TO RELATED APPLICATION

This application claims priority to German Patent Application No. 103 25 884.1 filed Jun. 6, 2003, which is incorporated herein by reference in its entirety.

FIELD OF THE INVENTION

The invention relates to a contact-making device for connecting an electric conductor electrically to an electronic component.

BACKGROUND OF THE INVENTION

Many conceivable applications for intelligent textiles (for example smart clothes or two-dimensional textiles) can be implemented by means of the integration of electronic components and modules in the textiles. Electrical connections between electronic modules distributed in the clothing can be implemented, for example, with conductive wires woven into textile fabrics.

According to the prior art, making contact with the conductive wires using the metallized pads of a printed circuit board 4 to be connected thereto is implemented by means of thermal connection of a sandwich structure. The contact-making operation according to the prior art is illustrated in FIG. 5. In this case, the stripped fiber 1 is placed on the metal pad 2 and a metallic counterpart 3 is placed on the other side of the stripped fiber 1 at the position corresponding to the metal pad 2. The metal pad 2 and the metallic counterpart 3 are then connected to each other by thermal connection. However, the known technique has the disadvantages that the stripped point 1 of the conductive fabric has to be adjusted with respect to the metal pad 2 of the printed circuit board 4 and that, for each connection, a metallic counterpart 3 has to be put in place and likewise adjusted.

SUMMARY OF THE INVENTION

It is thus an object of the present invention to provide a contact-making device, an electronic component and a method which permit simpler and improved connection of conductive fibers of a textile material to an electronic component.

According to the present invention, a contact-making device is provided for connecting an electric conductor, in particular a wire-like and/or thread-like electric conductor which is arranged in a textile material, electrically to an electronic component, comprising:
   a substrate material;
   at least one contact or contact pad or metallic pad, which is formed on the substrate material, to connect the conductor electrically to the contact-making device;
   the contact comprising a section which is movable or can be folded or folded over and a section which is immovable or fixed or firm; and
   the movable section being formed in such a way that, during the electrical connection operation, it can be arranged substantially on the surface side opposite the immovable section.

The movable section is preferably formed in such a way that, during the electrical connection operation, it can be or is folded on to the immovable section.

The movable section and the immovable section of the contact can be formed as units separated from one another or else as units connected to one another.

The electronic component can beg, for example, an integrated circuit (chip) or a conductor track which is applied to an insulator and which is connected to an external electronic component.

The textile material is preferably a fabric. In this case, a fabric is understood to be a two-dimensional textile structure comprising two thread systems, in particular crossing at right angles, which, as usual, are designated warp and weft. The warp lies in the longitudinal direction of the weaving process, while the weft direction runs transversely with respect to the weaving direction.

The conductor preferably comprises at least one weft and/or warp thread of the fabric.

A cutout or an aperture or a hole is preferably provided in the substrate material in the region of the substrate material covered by the movable section and/or the immovable section of the contact. Thus, the movable section and/or the immovable section of the contact are exposed by the substrate material.

The cutout in the substrate material is advantageous in particular when the movable section, the immovable section and the conductor are connected electrically to one another in a thermocompression step, such as soldering. In this case, contact can be made directly with the thermocompression device through the exposed region of the contact. Better heat transfer is thus made possible.

The movable section and the immovable section are preferably connected to one another. In this case, the connecting point between the movable section and the immovable section is preferably the point or the axis around which the movable section is moved when it is folded onto the immovable section.

The movable section and the immovable section are preferably formed in one piece.

The strength of the connection between the movable and the immovable section of the contact and the conductor can thus be increased.

At least one conductor track, which is connected electrically to the at least one contact, is preferably additionally provided on the substrate material.

Thus, the contact can be connected in a simple and advantageous manner to, for example, a component to be connected.

According to the invention, an electronic component is also provided which comprises a contact-making device according to the invention or a preferred embodiment thereof.

Furthermore, a method is provided for connecting an electrical conductor, in particular a wire-like and/or thread-like electric conductor which is arranged in a textile material, electrically to a contact-making device according to the invention or a preferred embodiment thereof, comprising the steps:
   providing a textile material, in which at least one flexible, wire-like and/or thread-like electric conductor is arranged;
   arranging a contact-making device on one surface side of the textile material at the point of the conductor to be connected;

arranging or folding over the movable section of the contact-making device on the surface side substantially opposite the immovable section of the contact-making device;

connecting the conductor electrically to the contact-making device.

The electrical connection step preferably comprises a step of the at least partial heating or warming of the contact or a thermocompression step.

The method can further preferably comprise a step of the thermal welding and/or adhesive bonding of the contact-making device and the textile material.

It is further preferred for the method further to comprise a step of the at least regional application or lamination of an insulating layer or adhesive layer to the contact-making device and the textile material which, according to the invention, are connected to one another.

BRIEF DESCRIPTION OF THE DRAWINGS

Further features, objects and advantages of the present invention become obvious from the following description of preferred embodiments with reference to the drawings, in which:

FIGS. 2B to 2D show the connection operation between the contact-making device shown in FIG. 2A and electric conductors arranged in a textile material;

FIG. 3A shows a contact-making device according to a second preferred embodiment of the present invention;

FIGS. 3B to 3D show the connection operation of the contact-making device shown in FIG. 3A;

FIG. 4 shows a sectional view which corresponds to a section corresponding to the line A—A from FIG. 2D, the contact-making device and the textile fabric being at least regionally sheathed.

DETAILED DESCRIPTION OF THE PREFERRED MODE OF THE INVENTION

Figure 1:
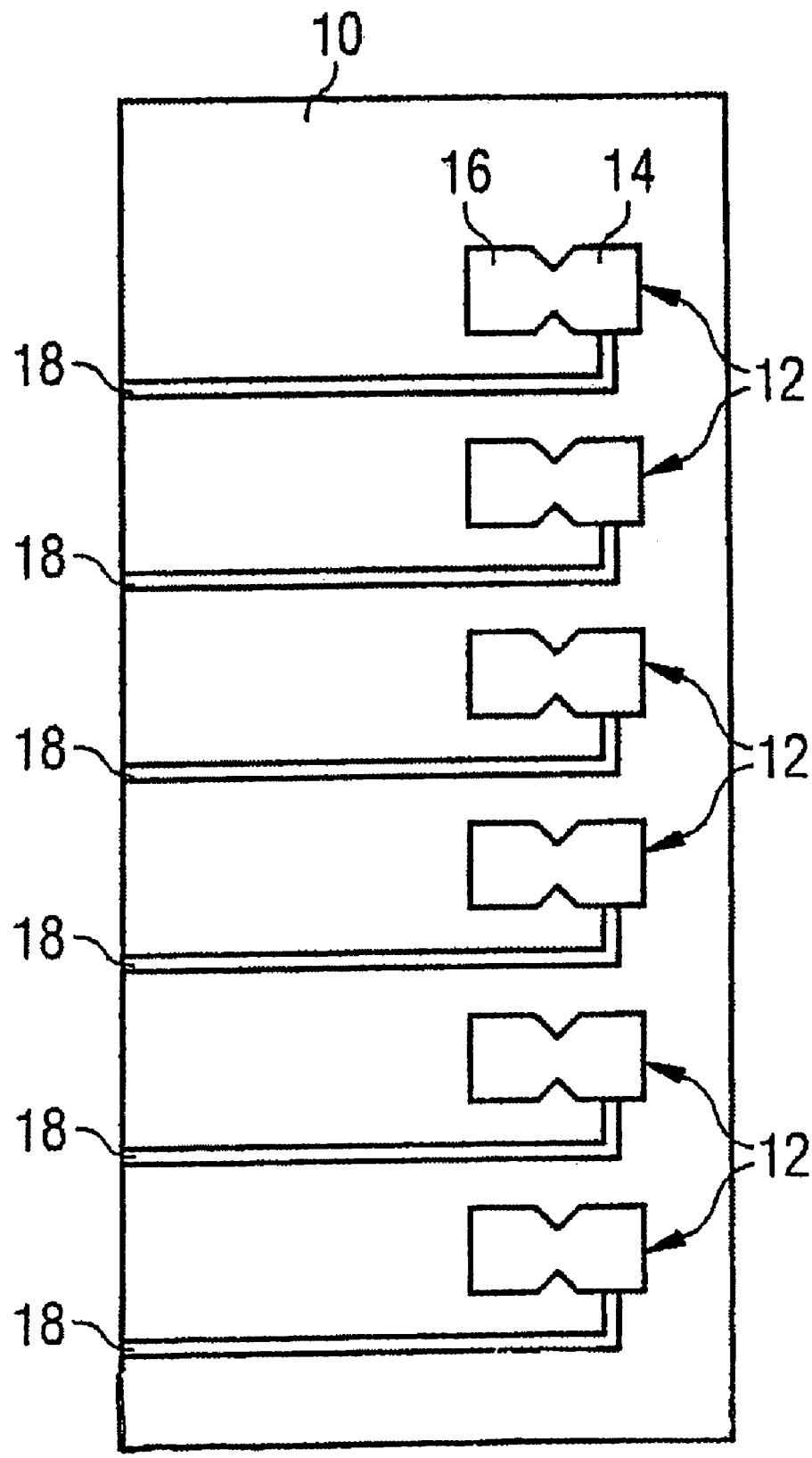
FIG. 1 shows a plan view of a contact-making device during the production process of a contact-making device according to the invention.

In the following text, first of all the production operation of a contact-making device according to the first preferred embodiment of the present invention will be described with reference to FIGS. 1 and 2A.

First of all, contacts 12 are applied to or arranged on or formed on a substrate material 10. In the embodiment illustrated in the present case, six contacts 12 are provided, it being possible, however, for any other required number of contacts 12 to be provided. The contacts 12 have two sections 14, 16, the section 14 in the finished contact-making device forming an immovable section 14, and the section 16 forming a movable section 16. In the embodiment illustrated, the sections 14, 16 are formed in one piece so as to be connected to one another. Alternatively, however, it is conceivable for the sections 14, 16 to be separated physically from one another, that is to say not connected to one another.

Furthermore, conductor tracks 18 are formed on the substrate material, are each connected to a contact 12 and are preferably used to connect the contact-making device to an electronic component (not shown).

Figure 2A:
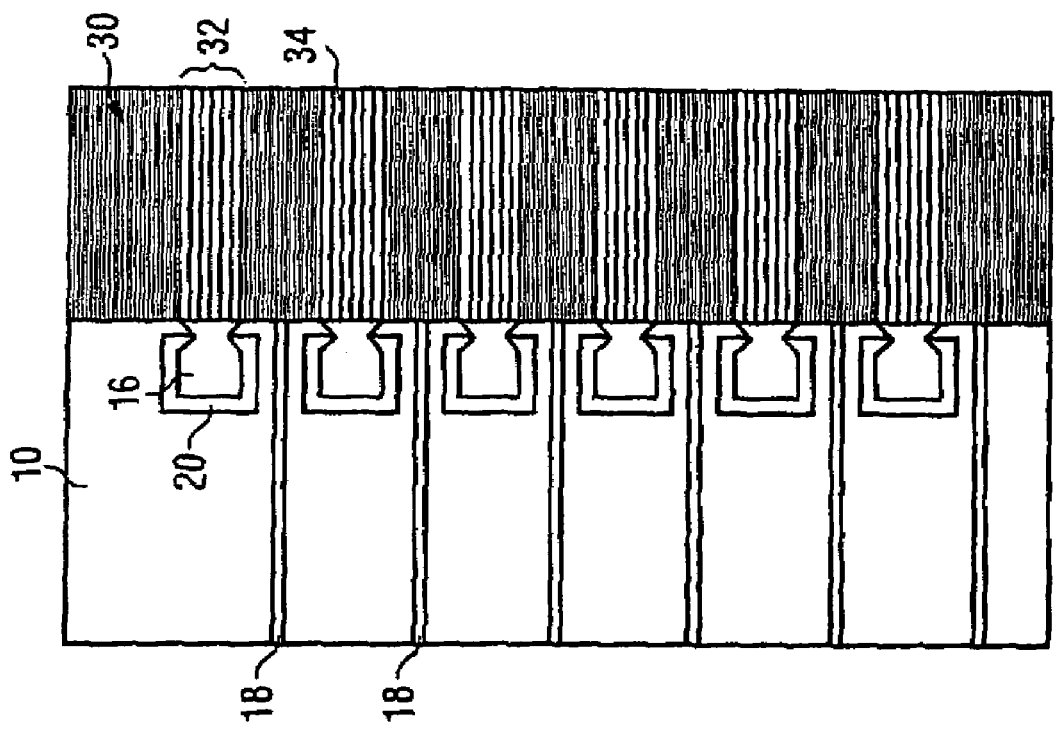
FIG. 2A shows a contact-making device according to a first preferred embodiment of the present invention.

In a next method step, as shown in FIG. 2A, the substrate material underneath the movable section 16 is removed, for example by lasering, etching, etc. This produces a cutout or an aperture or hole 20 in the substrate material 10. According to the first preferred embodiment, in this case the movable section 16 is substantially completely freed from substrate material 10 or exposed and can thus be moved.

Furthermore, in a thermocompression step, described later, the exposed movable section 16 can be supplied with warmth or heat in an advantageous manner.

Figure 2B:
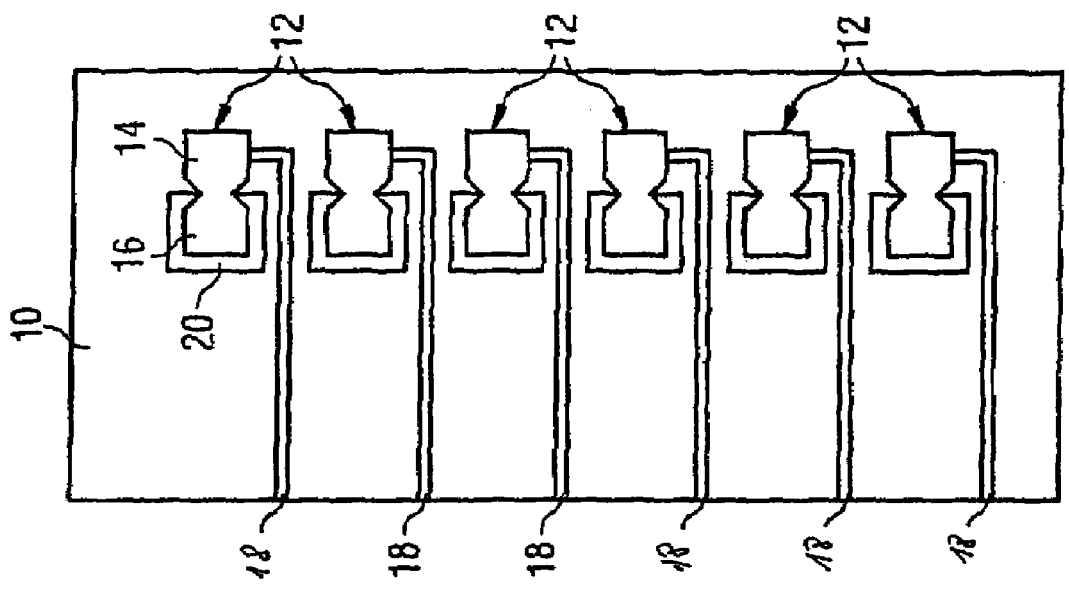

In the following text, the sequence of connecting the contact-making device with conductors arranged in a textile material will be described in detail with reference to FIGS. 2B to 2D.

The textile material 30 is preferably a fabric. In this case, a fabric is understood to be a two-dimensional textile structure of two thread systems, in particular crossing at right angles, which, as usual, are designated warp and weft. The warp lies in the longitudinal direction of the weaving process, while the weft direction runs transversely with respect to the weaving direction.

In the embodiment illustrated, six conductors 32 are woven into the textile material 30. In the embodiment illustrated, a conductor 32 in each case comprises a plurality of electric wires or yarns or fibers 34 which run substantially parallel to one another and which are preferably surrounded by an electrically insulating sheath or insulation (not illustrated).

First of all, at the point of the conductor 32 with which contact is to be made, the insulation of the wire 34 is removed, so that the inner conductor is exposed.

Then, the textile material 30 prepared in this way is arranged with the conductors 32 on the contact-making device in such a way that the immovable sections 14 of the contact 12 are substantially covered by the conductors 32.

After that, the movable section 16 of the contact 12 is folded over and then covers the conductor 32. The textile material 30 and the conductors 32 woven therein are substantially held and positioned between the sections 14, 16 of the contact 12, which now lie substantially opposite one another.

Moreover, as a result of folding over the movable section 16, good positioning of the textile material 30 with respect to the contact-making device can be achieved.

In a following thermocompression step, in which the warmth or heat is applied to the exposed movable section 16, a good bond can be formed between the contact 12 and the conductor 32. On the side facing the textile material 30, the contact 12 can preferably be provided with a soldering means, preferably tin solder, which penetrates into the textile material during the thermocompression step and thus forms a stable electrical and mechanical connection. Alternatively, a conductive adhesive can be used instead of the soldering means.

In the following text, a contact-making device according to the second preferred embodiment of the present invention will be described with reference to FIGS. 3A to 3D.

First of all, the production process of a contact-making device according to the second preferred embodiment will be described with reference to FIGS. 1 and 3A.

In a similar way to that described with respect to the first embodiment, an arrangement as shown in FIG. 1 is formed. In order to obtain a contact-making device according to the second embodiment, however, the substrate material 10 is removed underneath the immovable section 14 of the contact 12. This is indicated in FIG. 3A by the small dashed box with designation 42. Furthermore, a cut is made substantially peripherally around the movable section 16, so that the movable section 16 can be folded over or folded out of the plane of the substrate material. This is indicated in FIG. 3A by the designation 40.

Figure 3C:
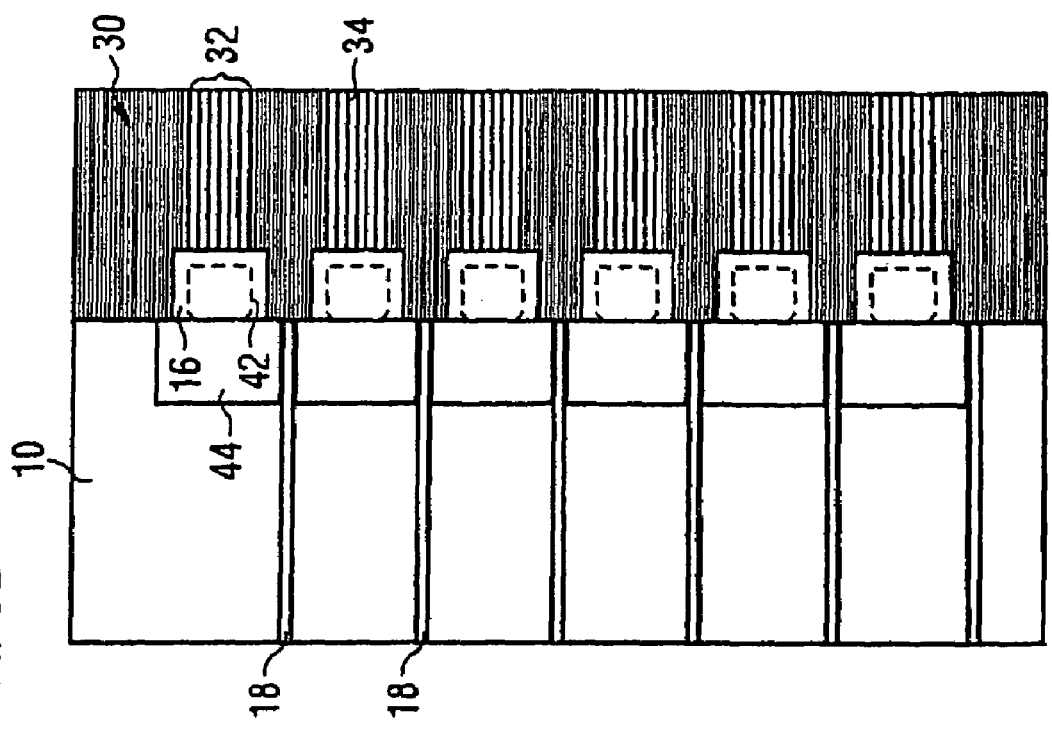
Figure 3D:
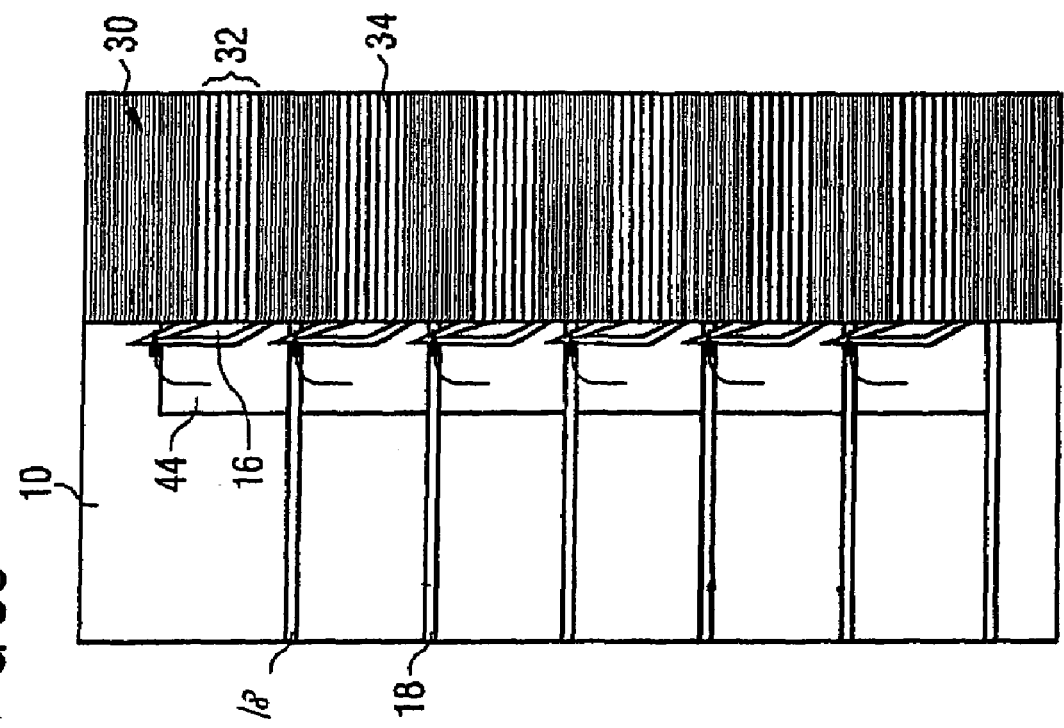
Figure 5:
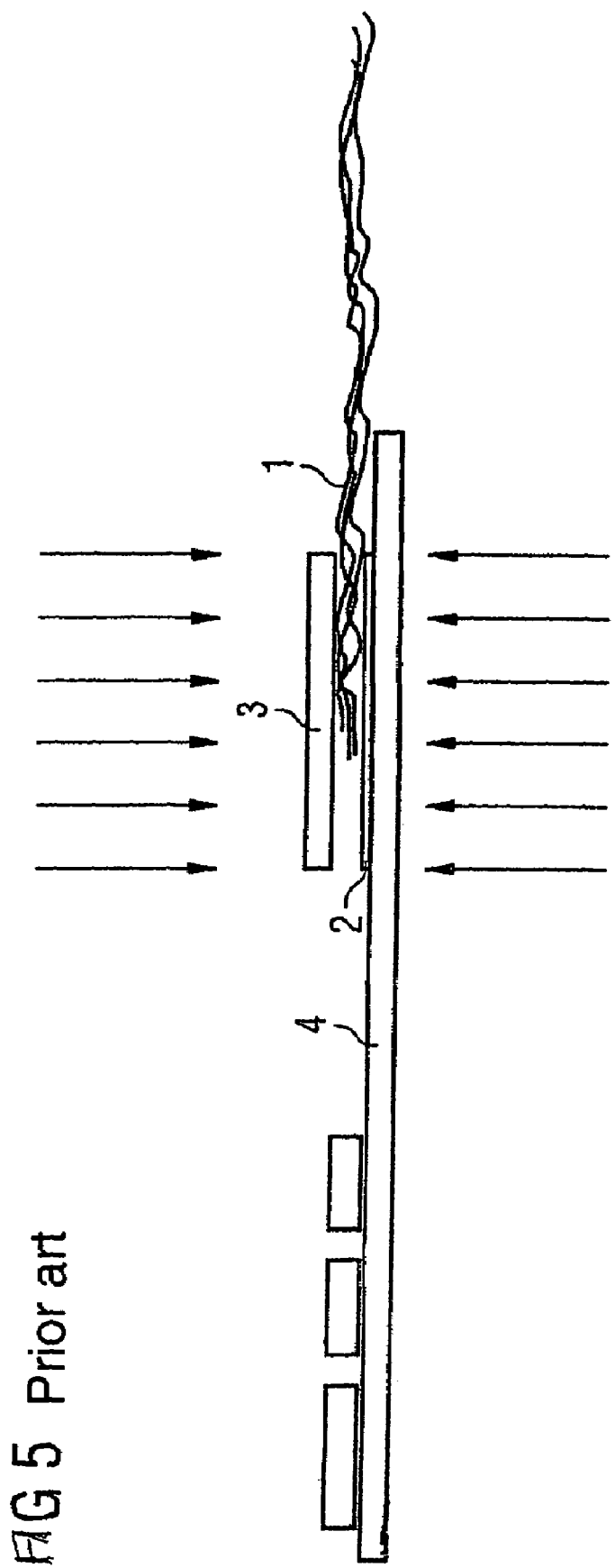
FIG. 5 shows a contact-making device according to the prior art.

In the following text, the connection operation will be described in detail with reference to FIGS. 3B to 3D.

In a similar way to that according to the first embodiment, a textile material 30, into which a conductor 32 is woven and in which the ends of the conductors 32 have been stripped, is arranged on the contact-making device. The movable section 16 is folded over onto the movable section 14 and the textile material 30 (FIG. 3C). In a thermocompression step, the sections 14, 16 of the contact 12 are then connected electrically to the textile material 30. In this case, in this embodiment, the heat or warmth is supplied through the cutout 42 in the substrate material 10 underneath the immovable section 14 of the contact 12.

The electrical connection can be made in a similar way to that described with respect to the first embodiment.

A contact-making device according to the first embodiment is shown in a connected state in FIG. 4. In this case, however, the contact-making device, the textile materials 30 and the conductor 32 have been coated on both sides, at least regionally, with an insulator 50. As a result of the additional coating, the contacts can firstly be protected against the penetration of dirt and moisture, and secondly a better mechanical hold can be formed between the textile material 30 and the contact-making device. The mechanical hold is additionally improved by the insulator 50 which is present on the upper side and underside penetrating through the cutout and joining here.

When a contact-making device according to the second preferred embodiment is used, an insulator 50 can likewise be provided.

In the embodiments described above, the contact-making device was in each case arranged in an edge or side region of the textile material 30. However, it is likewise conceivable to arrange the contact-making device in a middle region of the textile material 30. In this case, the insulation of the conductors is removed at the points with which contact is to be made and the nonconductive textile material is cut through, so the movable section 16 of the contacts 12 can pass through the textile material. Furthermore, the contacts 12 and all the cutouts 20, 42, 44 are preferably rotated through 90°. Thus, the stripped conductors 32 can be connected to the contact-making device laterally and not frontally, as in the embodiments illustrated.

The invention claimed is:

1. A method for connecting at least one electrical conductor, in particular a wire-like and/or thread-like electric conductor which is arranged in a textile material, electrically to a contact-making device, comprising the steps of:
   providing a textile material, in which the at least one electrical conductor is arranged;
   arranging a contact-making device on one surface side of the textile material at a point of the conductor to be connected;
   arranging a movable section of the contact-making device on the surface side substantially opposite an immovable section of the contact-making device; and
   connecting the conductor electrically to the contact-making device.

2. The method as claimed in claim 1 wherein the electrical connection step comprises a step of at least partially heating the contact.

3. The method as claimed in claim 1 which further comprises a step of a thermal welding and/or adhesive bonding of the contact-making device and the textile material.

* * * * *

UNITED STATES PATENT AND TRADEMARK OFFICE
CERTIFICATE OF CORRECTION

PATENT NO. : 7,179,140 B2  Page 1 of 1
APPLICATION NO. : 10/861316
DATED : February 20, 2007
INVENTOR(S) : Stefan Jung et al.

It is certified that error appears in the above-identified patent and that said Letters Patent is hereby corrected as shown below:

At column 2, line 7, "beg" should read --be--

Signed and Sealed this

Seventeenth Day of April, 2007

JON W. DUDAS
*Director of the United States Patent and Trademark Office*